METHOD OF FABRICATION OF SOLDER REFLOW INTERCONNECTIONS FOR FACE DOWN BONDING OF SEMICONDUCTOR DEVICES

Filed Sept. 3, 1968

INVENTORS
EDWARD F. DUFFEK JR.
ILAN A. BLECH
BY Roger J. Borovoy
Alan H. MacPherson
ATTORNEYS United States Patent Office 3,480,412
Patented Nov. 25, 1969

3,480,412
METHOD OF FABRICATION OF SOLDER REFLOW INTERCONNECTIONS FOR FACE DOWN BONDING OF SEMICONDUCTOR DEVICES

Edward F. Duffek, Jr., Los Altos, and Ilan A. Blech, Sunnyvale, Calif., assignors to Fairchild Camera and Instrument Corporation, Syosset, N.Y., a corporation of Delaware
Filed Sept. 3, 1968, Ser. No. 756,778
Int. Cl. H01k *1/00;* C23c *13/06;* C23b *5/50*
U.S. Cl. 29—195 15 Claims

ABSTRACT OF THE DISCLOSURE

Solder bumps possessing long life, low electrical resistance and good adherence to underlying materials are produced on precisely defined areas of a semiconductor wafer containing a plurality of integrated circuit dies, by either vacuum deposition techniques or by a combination of vacuum deposition, electroplating, and etching techniques.

BACKGROUND OF THE INVENTION

Field of the invention

This invention relates to semiconductor devices and in particular to a process for the simultaneous placement of a plurality of bonding pads on a semiconductor die containing a multiplicity of semiconductor elements.

Description of the prior art

An integrated circuit incorporates a large number of interconnected elements, such as transistors, diodes, resistors, and capacitors, on a slice of semiconductor material, typically silicon. To provide electrical contact with these elements, numerous metal contacts are attached to these elements, or, in the case of transistors and diodes, to the various P and N regions of these elements. These metal contact layers, though selectively interconnected to provide the desired operation of the integrated circuit, are in general separated from each other and the remainder of the elements on the semiconductor slice by insulation. This semiconductor slice, together with its overlying layers of insulation and metal contacts, is hereafter called a "die."

In the manufacture of integrated circuits, a large number of "dies" or "dice" are usually processed together, as part of a single "wafer" of semiconductor material. After the desired integrated circuits have been formed on the various dies contained in the wafer, the water is cut up into its constituent dies. The integrated circuit or circuits on a die must then be connected to the other circuits outside the die with which they are designed to operate. Typically, this is done by bonding lead wires from selected metal contacts on the die to metal contact layers on one surface of a support substrate. Such bonding, whether by ultrasonic or thermo-compression welding techniques, usually proceeds on a lead-by-lead basis and thus is time consuming and expensive.

To replace these lead wires, the prior art has developed a technique using solder bumps. To produce these solder bumps—and these bumps are typically produced before the wafer is cut into dies—a glass layer is deposited over the thin film metal contact layers attached to the elements on each die in the wafer. Windows are etched through the glass layer to the underlying metal and then layers of an appropriate wettable metal, such as chromium-copper or chromium-nickel, are evaporated over the glass layer and the windows. The metal is then selectively removed from all areas except over the windows in the glass layer so as to form metal pads over these areas. Next, the wafer is dipped into a bath of molten solder which wets the pad areas and forms the solder bumps.

After the wafer has been cut into dies, bonding is accomplished by placing each die face down on a matching support substrate and applying heat and pressure. Dies so bonded are called "flip chips."

Unfortunately, often this technique results in unreliable bonds because the foreign metals—such as chromium or nickel—used in fabricating such solder bumps can readily consume the underlying thin metal contacts and cause mechanical or electrical degradation of these contacts.

SUMMARY OF THE INVENTION

This invention, on the other hand, overcomes these disadvantages of the prior art techniques for producting electrical contacts on integrated circuits. The solder bumps or bonding pads of this invention are produced in such a manner as to have long life and good electrical and mechanical properties. In addition, the method of this invention permits the simultaneous placement of bonding pads in any geometric arrangement on carefully specified areas of an integrated circuit die while the die is still part of a wafer. Because the technique of this invention produces solder bumps which require low bonding forces and low bonding temperatures in the range of 600° F. to 650° F.—about 100° F. below the temperatures required for thermo-compression bonding of flip chips—the amount of degradation in integrated circuit reliability due to high bonding temperatures is reduced relative to the amount of this degradation associated with the higher prior art bonding temperatures. Moreover, because the solder bumps produced by this invention melt and "flow" during the bonding process to compensate for surface unevenness in the underlying substrate, this unevenness has little effect on the reliability of the bonding process. Thus, a large number of pads per die may be formed without concern over support substrate planarity or die breakage. Finally, the solder bumps of this invention adhere to the underlying die material with little degradation in strength with time.

To produce the solder bumps of this invention, a wafer containing a plurality of dies each covered by both insulation and a layer or layers of contact metal, such as aluminum, is covered with a second insulating layer, such as silicon dioxide. Suitable windows are etched in this second insulating layer. Then, a thick layer of conducting metal, such as aluminum, typically from 6 to 10 microns thick, is placed onto the wafer followed immediately by a layer of nickel. Usually these two layers are vacuum deposited on the wafer. A photosensitive mask is then placed over the layer of nickel with the regions of nickel on which the solder bumps are to be placed left unmasked. After careful cleaning, a plurality of layers of selected metals, including solder, are placed over this layer of nickel. Typically, these layers consist of a thick barrier layer of nickel followed by layers of gold, tin, and gold although, as discussed later, other solders can also be used. In accordance with one embodiment of this invention, these plurality of layers are electroplated over the nickel. Finally, the photoresist and portions of both the first deposited layer of nickel and the thick layer of conducting metal, are removed to produce the desired solder bump structure.

The technique of this invention allows the precise manufacture of many solder bumps at the same time. The thick vacuum-deposited layer of aluminum materially reduces the electrical and mechanical degradation of the solder bump with time due to nickel migration through the aluminum while the barrier layer of nickel prevents the formation of gold-aluminum compounds. While the bumps of this invention are more expensive to make than are prior art contacts, the resulting bumps are much cheaper to bond to external circuitry than are the prior art lead wires and more reliable than the prior art bumps. Although the bonding process is carried out at temperatures on the order of 600° F. to 650° F., a bond capable of withstanding such temperatures is created because the solder bumps, once melted, form an alloy possessing a much higher remelting temperature.

An alternative method of producing solder bumps on an integrated circuit die uses evaporation techniques. Selected metals, evaporated in sequence from a small source, pass through carefully defined windows in a metal foil mask. Placed immediately behind the mask is the die. Thus the evaporated metals deposit in layers on the regions of the die defined by the mask windows, thereby producing the desired solder bumps.

This invention will be more fully understood in light of the following detailed description taken together with the accompanying drawings.

DESCRIPTION OF THE PREFERRED EMBODIMENTS

One method of implementing this invention is described with the aid of FIGS. 1–6. While this method is described in terms of gold-tin solder bumps placed on a silicon wafer overlaid by a layer of silicon dioxide and a layer of aluminum, it should be understood that other solder-semiconductor combinations can also be employed using the principles of this invention. Such other systems might, for example, involve a gold-germanium solder over a germanium barrier on thick aluminum contacts. Furthermore, while for simplicity, this invention is described by showing in the figures only a portion of a semiconductor wafer with a single solder bump thereon, rather than a whole wafer, it should be understood that in implementing this invention, a plurality of solder bumps are placed upon each die in a wafer being processed, rather than just a single solder bump.

Figure 1:
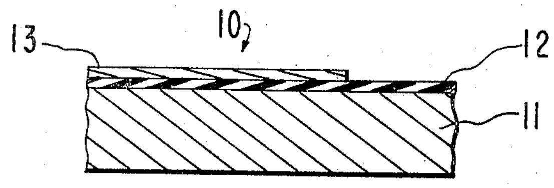
FIG. 1 shows a portion of a typical semiconductor wafer with overlying layers of insulation and aluminum.

FIG. 1 shows a portion of wafer 10 consisting of silicon 11 with an overlying insulating layer 12 of silicon dioxide. A layer 13 of aluminum, typically 1 micron thick, overlies the silicon dioxide. Layer 13, composed of many electrically isolated regions of aluminum, makes selected electrical contact with the elements, or with the P and N regions of the transistors and diodes (not shown) previously produced within the silicon 11. Wafer 10 is of a type well-known in the semiconductor arts and usually contains many integrated circuit dies.

Figure 2:
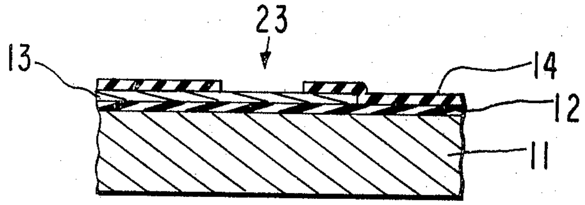
FIG. 2 shows the wafer of FIG. 1 with an additional dielectric layer placed thereon.

As shown in FIG. 2, a second insulating layer 14, typically a glass about 1 micron thick, is next deposited on wafer 10. Windows, such as window 23, are etched in this layer by well-known techniques to expose aluminum 13.

Figure 3:
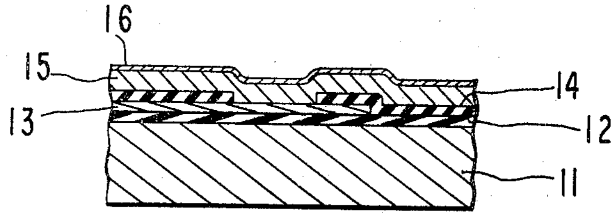
FIG. 3 shows the wafer of FIG. 2 with a layer of thick aluminum and a layer of nickel evaporated thereon.

Next, as shown in FIG. 3, a thick layer 15 of aluminum, typically 6 to 10 microns thick, is evaporated onto wafer 10. Immediately thereafter, a layer 16 of nickel is evaporated onto aluminum layer 15. Layer 16 is typically 0.3 micron thick. By evaporating the nickel immediately after the aluminum has been evaporated onto the wafer, in a vacuum of approximately $10^{-6}$ to $10^{-7}$ torrs, no disturbing electrical resistance between the aluminum and the nickel due to oxidation of the aluminum layer 15 is encountered. This insures that the resistivity of the contact region between the aluminum layer 15 and the nickel layer 16 will remain negligible. Before the evaporation process, the wafer is cleaned in a $H_3PO_4$ solution for about 10 seconds at 140° F., rinsed in deionized water and dried. The $H_3PO_4$ cleans the exposed aluminum surface of layer 13 and thereby improves the adhesion of aluminum layer 15 to layer 13 without attacking insulating layer 14.

Vacuum evaporation of metals is well-known in the semiconductor arts and thus will not be described here in detail. However, of importance is that the wafer surface should be maintained between 100° C. and 300° C., and preferably near 200° C., to obtain good adhesion of the aluminum and nickel layers 15 and 16 to aluminum layer 13 and to each other without alloying.

Figure 4:
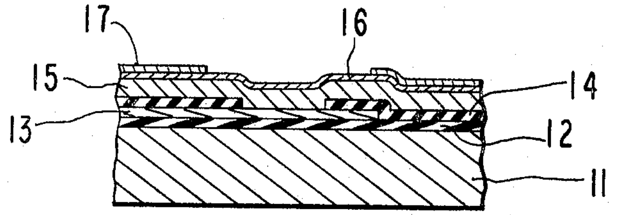
FIG. 4 shows the wafer of FIG. 3 with photoresist placed in a selected pattern over the layer of nickel.
Figure 5:
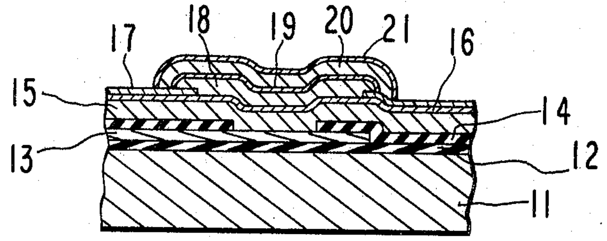
FIG. 5 shows the wafer of FIG. 4 with layers of nickel, gold, tin, and gold electroplated in that order over the windows left in the photoresist.

To define the regions on which the solder bumps are to be placed, a photosensitive mask 17 is placed on nickel layer 16 as shown in FIG. 4. This photoresist mask—typically, though not necessarily of the negative type exemplified by Kodak Thin Film Resist—is applied, by techniques well-known in the art, over selected regions of nickel layer 16 to define the regions of layer 16 on which the solder bumps are to be placed. Because the windows in mask 17 can be defined with an accuracy of ±5 microns, the locations of the solder bumps can likewise be defined with similar accuracy. However, before applying mask 17, wafer 10 is cleaned by dipping it for 10 seconds in 10% $HNO_3$ at 77° F., rinsing in deionized water, and drying. This cleaning improves the adhesion of mask 17 to the surface of nickel 16.

Next, a layer 18 (FIG. 5) of nickel 8 to 10 microns thick is electroplated over those areas of evaporated nickel layer 16 exposed by the windows in the photoresist 17. As will be described shortly, the surface of nickel layer 16 is carefully prepared prior to this electroplating to ensure a clean, low resistance bond between the vacuum-deposited and the electroplated nickel layers. Then, layers 19, 20, and 21 of gold, tin, and gold, respectively, are electroplated over layer 18 of nickel. Layers 19, 20, and 21 are typically 1.25, 5, and 2.5 microns thick, respectively. Nickel layer 18 serves as a hard pedestal and a diffusion barrier between the gold, tin, gold solder layers 19, 20, and 21, and the aluminum layer 15.

Figure 6:
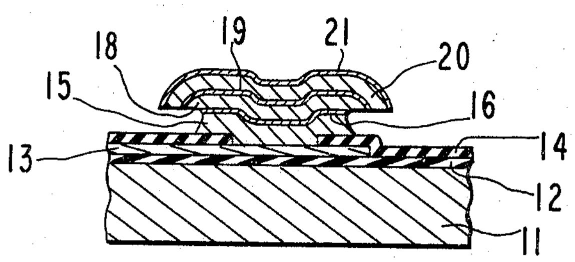
FIG. 6 shows the wafer of FIG. 5 after the photoresist and selected layers of aluminum and nickel have been removed.

Finally, as shown in FIG. 6, the photoresist 17 and selected portions of aluminum 15 and nickel 16 are removed by etching. The resulting structure, as shown in FIG. 6, is the desired solder bump.

While the electroplating techniques used in this invention are based on well established practices capable of giving adherent, stable metal coatings—see, for a description of these practices, A. K. Graham's Electroplating Engineering Handbook published by Reinhold Publishing Co. of New York in 1955—the preparation of the surface of nickel layer 16 to ensure uniform, high quality plating of additional nickel layer 18 is an involved, complicated process. Before the electroplating begins, an organic resist is coated over the edges and backside of wafer 10 to prevent electroplating these surfaces during the electroplating of the solder bumps on the front side of the wafer.

Next, layer 16 is thoroughly cleaned. This cleaning removes any photoresist contamination, organic soils, atmospheric oils, and surface oxidation. In carrying out this cleaning, wafer 10 is first dipped for about 5 seconds into an alkali cleaning solution containing an alkaline metal cleaner with a pH of approximately 13 to 14. This cleaning solution, at about 110° F., removes organic compounds. Wafer 10 is then rinsed in tap water for about 5 seconds and dipped for about 5 seconds into a 10% hydrochloric acid solution at approximately 77° F. This acid dip removes any impurities deposited during the alkaline cleaning operation or left after this cleaning operation. After a rinse in deionized water, wafer 10 is then dipped into a 10% nitric acid solution at 77° F. for about 5 seconds to clean the exposed surface of nickel layer 16. Nitric acid actually etches this surface and thus insures that pure nickel is on the surface of layer 16 prior to the electroplating. Then this cleaning process, beginning with the alkali cleaning but omitting the nitric acid cleaning, is repeated. But this second time, the alkali cleaning is electrolytic, with the nickel cathodic.

An electrolytic nickel activated dip is next used to ensure that the nickel surface is absolutely clean. The nickel surface during this dip is made cathodic by being connected to a three-volt power source. A steel or nickel anode is used during this dip. The nickel activator actually reduces any oxidized regions on the exposed surface of nickel layer 16. This dip lasts 15 seconds. The activator solution is typically C–12 activator solution, supplied by Millhorn Chemical and Supply Co., a solution well-known in the electroplating arts. The wafer is examined while in the activator dip to ensure cleanliness by observing the formation of hydrogen gas over the exposed nickel surfaces of layer 16. Nonuniform gas formation over these surfaces indicates nickel surface contamination which would result in nonadherent surfaces. Upon noting such nonuniform gas formation, the wafer is stripped of photoresist layer 17 and reprocessed, as described above, with new photoresist.

After the activator dip, the surface of nickel layer 16 is almost receptive to electroplating. First, however, wafer 10 is dipped in a 2% sulfuric acid solution for about 5 seconds to remove any alkaline impurities deposited by the electrolytic nickel activator. Upon removal from this dip, the wafer is spray rinsed in deionized water for about 5 seconds. The surface of nickel layer 16 is now ready for electroplating.

Wafer 10 is now placed in any one of a wide variety of nickel electroplating solutions. A sulfamate nickel plating solution might, for example, be used. Throughout the electroplating, nickel layer 16 carries current. Electrical contact to this layer is made by piercing photoresist layer 17 (FIG. 4) with a conductor.

Upon electroplating nickel layer 16 to the desired thickness, wafer 10 is removed from the electroplating solution and spray rinsed in deionized water for about 5 seconds. Wafer 10 is then dipped in a 10% hydrochloric acid solution at about 77° F. for about 5 seconds to remove any alkali impurities deposited during the electroplating. Following this dip, the wafer is again spray rinsed in deionized water for about 5 seconds. Then, the cleaned surface of nickel layer 18 is immediately electroplated for about 20 seconds with 24 karat gold. An acid gold strike solution at about 120° F. is used for this electroplating. After a spray rinse in deionized water for about 5 seconds, the electroplating of gold layer 19 (FIG. 5) is continued using as an electroplating solution, a high purity acid gold of a type commonly used in the electronics industry for plating electronic components. Upon completion of the electroplating of layer 19, the wafer is again spray rinsed in deionized water for about 5 seconds and is then dipped into a 20% sulfuric acid solution at about 77° F. for about 5 seconds. This sulfuric acid dip removes any prior wetting agents, brighteners or stabilizers deposited on the wafer from the prior electroplating solution. A 5 second deionized water spray rinse follows this sulfuric acid dip.

Layer 20 of tin is electroplated onto the wafer using an acid-tin electroplating solution commonly used in the electronics industry. Upon completion of this layer, the wafer is again spray rinsed for about 5 seconds in deionized water and dipped into a 20% sulfuric acid solution also for 5 seconds. This acid dip again removes wetting agents, brighteners, or stabilizers remaining from the electroplating. A 5 second deionized water spray rinse again follows. Immediately after this rinse, wafer 10 is placed in a cyanide gold electroplating solution at about 77° F. for 30 seconds for a cyanide gold "strike." This ensures that the following layer of gold is deposited on a clean surface. Tin, an active metal, is not easy to electroplate and thus this gold strike is essential to cover the tin while it is clean. After this gold strike the wafer is again spray rinsed in deionized water for about 5 seconds and then placed in a standard acid gold electroplating solution for the electroplating of the remainder of gold layer 21. Upon completion of layer 21, wafer 10 is spray rinsed for 10 seconds in deionized water and dried in nitrogen gas.

All the steps in the above outlined process involving the passage of current through the wafer are made with an electrical potential applied across the anode and cathode during both immersion and removal of the wafer from the electroplating solution. This minimizes contamination of the electroplating solutions and prevents loss of bump adhesion.

Upon completion of the electroplating, photoresist layer 17 is removed and portions of layers 15 and 16 of aluminum and nickel respectively are selectively etched away. This etching must be carefully done to ensure minimum undercutting of nickel layer 18 and solder layers 19 through 21. Use of a fresh etchant and precise control of etchant temperature and etching time are necessary to avoid undercutting. Typically, an acid etchant is used for etching nickel layer 16 and an alkaline etchant is used for removing aluminum layer 15. However, the acid etchant could also be used to remove aluminum layer 15 if desired. The etching away of selected portions of nickel and aluminum layers 16 and 15 occurs without substantially undercutting nickel layer 18 or solder layers 19 through 21. As a result, the solder bump resembles to some extent a mushroom with a top larger in diameter than its trunk.

Throughout all of the above processing, contamination of the silicon by alkali bearing or other impurities is not likely due to the thick aluminum and silicon dioxde layers between the processing solutions and the silicon interface.

Placing nickel directly on aluminum as represented by layers 16 and 15 in FIG. 3, though necessary to provide a suitable surface for electroplating and to prevent oxidation of the aluminum, results in diffusion of the nickel into the aluminum, forming nickel-aluminum compounds such as NiAl, and $Ni_3Al$. These compounds extend into the aluminum and, upon reaching the silicon dioxide layer 12 directly beneath aluminum layer 13, degrade both the electrical and the mechanical properties of the aluminum-silicon dioxide bond. Thus, according to this invention, aluminum layer 15 is made quite thick to increase the time required for the nickel to diffuse through the aluminum and to thereby increase the lifetime of the aluminum bond.

The thick nickel layer 18, on the other hand, is required to prevent aluminum 15 from immediately forming compounds with the solder. Although the solder used in the above described solder bumps is a gold-tin solder, this solder consists of a layer of tin sandwiched between two layers of gold rather than just a layer of gold and a layer of tin. The first layer of gold is necessary because tin does not adhere to nickel but does to gold. The second gold layer prevents oxidation of the tin. Basically, this solder consists of 40 to 50% tin and 60 to 50% gold, by weight. A solder with this composition melts at approximately 640° F. and bonds at between 600° F. and 650° F. Once bonded, the solder remelts at a much higher temperature due to the fact that gold on the substrate metallization dissolves into the solder thereby raising its melting point.

Because the solder bumps on heating are pliable and because they contain a great deal of material in their mushroom-like tops, these bumps contain enough material to flow and conform to uneven substrates, thereby eliminating or reducing die breakage during pressure bonding of dies to uneven substrates. Because the prior art flip-chip thermo-compression bonding occurred at about 750° F., that is about 100° F. higher than the bonding temperatures for the solder reflow bumps of this invention, degradation in the quality of bonded dies due to high bonding temperatures is considerably reduced by the solder bumps of this invention compared to the degradation obtained using prior art solder bumps.

While this invention has been described as using a gold-tin-gold solder, other solders can also be used, if desired. For example, a solder consisting of lead, tin, and gold, typically in layers 5, 5, and 2.5 microns thick respectively, can be used in the place of the gold-tin-gold solder. Similarly, a gold-indium-gold solder with layers 1.25, 5, and 2.5 microns thick, respectively, or a zinc-gold solder with layers of zinc and gold 10 and 2.5 microns thick respectively, can also be used. All of these solders are placed on a thick pedestal of aluminum, which increases the time required for the overlying nickel to migrate through the aluminum, and a thick barrier layer of nickel, which prevents the overlying solder from immediately forming components with the aluminum pedestal.

All of these solders are electroplated onto the barrier layer of nickel. The electroplating techniques, per se, are well-known. However, as in the above-described procedure for electroplating gold-tin-gold solder onto nickel, the wafer in each case must be appropriately cleaned prior to electroplating to ensure acceptable mechanical and electrical properties of the resulting solder bumps. With each of the above solders, the nickel layer is required to provide a surface on which the overlying solder can be electroplated. However, with special preparation of the aluminum surface, zinc can be electroplated directly onto aluminum without an intermediate layer of nickel.

An alternative method for producing the solder bumps of this invention uses vacuum deposition techniques. A metal mask clamped to the wafer is used to define areas of the wafer on which solder bumps are to be deposited. The mask is usually a metal foil, typically Kovar, with a 2 to 3 mil thickness. The masked wafer is placed in an evaporation chamber and the metals to be evaporated onto the wafer are placed in crucibles within the chamber. Each crucible is heated in turn to melt the metal contained therein. With a vacuum of $10^{-6}$ to $10^{-7}$ torrs the melted metal rapidly evaporates through windows in the mask onto the wafer forming the desired metal layers. A typical evaporation procedure adaptable for use in this invention is described in "Thin Film Microelectronics," edited by L. Holland and published in 1965 by John Wiley and Sons, Inc. on pages 171–173.

What is claimed is:

1. The combination of:

a die of semiconductor material consisting of a slice of silicon containing on one surface thereof a first layer of insulation and a first layer of aluminum;

a plurality of solder bumps on said first layer of aluminum, each solder bump consisting of:

a second layer of aluminum on said first layer of aluminum;

a layer of nickel overlying said second layer of aluminum to provide a strong mechanical bond with solder;

a first layer of gold overlying said layer of nickel to provide a platable surface;

a layer of tin overlying said first layer of gold, and;

a second layer of gold overlying said layer of tin.

2. Structure as in claim 1 in which said layer of nickel comprises two contiguous adhering layers of nickel, the first vacuum deposited, and the second electroplated on the first.

3. A solder bump placed on a metal contact layer attached to a wafer of semiconductor material which comprises:

a layer of conducting metal placed on a selected area of said metal contact layer;

a first layer of nickel placed over said layer of conducting metal; and a plurality of layers of selected metals placed over said first layer of nickel, a selected number of said plurality of layers comprising solder.

4. Structure in claim 3 in which said layer of conducting metal and said first layer of nickel are vacuum deposited and said plurality of layers of selected metals are electroplated over said first layer of nickel.

5. Structure as in claim 3 in which said layer of conducting metal is aluminum.

6. Structure as in claim 3 in which said plurality of selected metals comprise:

a second layer of nickel electroplated on said first layer of nickel;

a first layer of gold electroplated on said second layer of nickel;

a layer of tin electroplated on said first layer of gold; and, a second layer of gold electroplated on said layer of tin.

7. Structure as in claim 5 in which said layer of aluminum is on the order of 6 to 10 microns thick and said first layer of nickel is approximately 0.3 micron thick.

8. Structure as in claim 6 in which said second layer of nickel is on the order of 8 to 10 microns thick;

said first and second layers of gold are each approximately 1.25 and 2.5 microns thick respectively; and, said layer of tin is approximately 5 microns thick, thereby to provide a solder composed by weight of from 40 to 50 percent tin, and the remainder gold.

9. Structure as in claim 3 in which said plurality of selected metals comprise:

a barrier layer of nickel electroplated on said first layer of nickel;

a first layer of gold electroplated on said barrier layer of nickel;

a layer of indium electroplated on said layer of gold; and, a second layer of gold electroplated on said layer of indium.

10. Structure as in claim 3 in which said plurality of selected metals comprise:

a barrier layer of nickel electroplated on said first layer of nickel;

a layer of lead electroplated on said barrier layer of nickel;

a layer of tin electroplated on said layer of lead; and, a layer of gold electroplated on said layer of tin.

11. Structure as in claim 3 in which said plurality of selected metals comprise:

a barrier layer of nickel electroplated on said first layer of nickel;

a layer of zinc electroplated on said barrier layer of nickel; and, a layer of gold electroplated on said layer of zinc.

12. The method of producing solder bumps on a semiconductor wafer which comprises:

vacuum depositing first a layer of aluminum on selected portions of said wafer and then immediately thereafter vacuum depositing a layer of nickel over said layer of aluminum, thereby to form a bond between said aluminum and nickel layer possessing low electrical resistance;

cleaning said nickel layer; and electroplating on said cleaned, vacuum deposited, nickel layer additional layers of nickel and selected solder constituents.

13. The method of claim 12 including the additional step of:

etching said resulting structure to remove portions of said vacuum deposited layers of aluminum and nickel, thereby to produce solder bumps each composed of overhanging layers of electroplated nickel and selected solder constituents supported by a vacuum-deposited pedestal of aluminum and nickel.

14. The method of claim 12 in which the step of cleaning said nickel layer comprises:

(1) dipping said water for a selected time into an alkali cleaning solution;

(2) rinsing said wafer in deionized water;

(3) placing said wafer for a selected time in a hydrochloric acid solution at a selected temperature;

(4) rinsing said wafer in deionized water;

(5) placing said wafer in a nitric acid solution at a selected temperature for a selected time to ensure that said nickel layer is pure;

(6) placing said wafer for a selected time in an electrolytic alkaline cleaning solution with said nickel layer cathodic;

(7) repeating steps (2) through (4);

(8) placing said wafer in an electrolytic nickel activated dip and applying a voltage to said nickel layer to make this layer cathodic thereby to reduce any oxidized regions on the surface of said nickel layer;

(9) placing said wafer in a sulfuric acid solution for a selected time to remove any alkaline impurities deposited by said electrolytic nickel activated dip; and,

(10) rinsing said wafer in deionized water.

15. The method of claim 12 in which said electroplating step comprises:

electroplating on said cleaned, vacuum-deposited, nickel layer a second layer of nickel, a first layer of gold, a layer of tin, and a second layer of gold, said first and second layers of gold and said layer of tin comprising solder composed of between 40 and 50 percent by weight tin and the remainder gold.

References Cited

UNITED STATES PATENTS

| | | | |
|---|---|---|---|
| 3,361,592 | 1/1968 | Quetsch et al. | 117—212 |
| 3,331,996 | 7/1967 | Green | 317—234 |
| 3,316,628 | 5/1967 | Lang | 29—472.7 |
| 3,290,127 | 12/1966 | Kahng et al. | 29—195 |
| 3,287,612 | 11/1966 | Lepselter | 317—235 |

JOHN H. MACK, Primary Examiner

R. L. ANDREWS, Assistant Examiner

U.S. Cl. X.R.

29—197.5, 199; 204—38